United States Patent
Nagahashi et al.

(10) Patent No.: US 7,111,210 B2
(45) Date of Patent: Sep. 19, 2006

(54) ACCELERATED TEST METHOD FOR FERROELECTRIC MEMORY DEVICE

(75) Inventors: Katsuki Nagahashi, Osaka (JP); Atsushi Noma, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 456 days.

(21) Appl. No.: 10/632,960

(22) Filed: Aug. 4, 2003

(65) Prior Publication Data

US 2004/0041574 A1 Mar. 4, 2004

(30) Foreign Application Priority Data

Aug. 28, 2002 (JP) .............................. 2002-248240

(51) Int. Cl.
*G11C 29/00* (2006.01)
*G01R 31/28* (2006.01)

(52) U.S. Cl. ...................... 714/718; 714/721; 714/722; 714/724

(58) Field of Classification Search ................ 714/721, 714/742, 718
See application file for complete search history.

(56) References Cited

U.S. PATENT DOCUMENTS 5,920,574 A * 7/1999 Shimada et al. ............ 714/721
5,929,475 A * 7/1999 Uemoto et al. ............. 257/295
6,727,156 B1 * 4/2004 Jung et al. ................... 438/396

FOREIGN PATENT DOCUMENTS

| DE | 100 58 779 A1 | 6/2002 |
| EP | 0 836 197 A2 | 4/1998 |
| JP | 10-106291 | 4/1998 |
| JP | 11-102600 | 4/1999 |
| JP | 11-174026 | 7/1999 |
| WO | WO 01/22426 A1 | 3/2001 |

OTHER PUBLICATIONS

"Polarization Fatigue Characteristics of Sol-Gel Ferroelectric", Takashi Mihara et al., Jpn. J. Appl. Phys. vol. 33 (1994) pp. 3996-4002, Part 1, No. 7A, Jul. 1994.

Traynor S.D., et al. "Capacitor test simulation of retention and imprint characteristics for ferroelectric memory operation." Integrated Ferroelectrics, New York, NY, vol. 16, 1997, pp. 63-76, XP-002099256.

* cited by examiner

*Primary Examiner*—Guy Lamarre
*Assistant Examiner*—Saqib J. Siddiqui
(74) *Attorney, Agent, or Firm*—McDermott Will & Emery LLP

(57) ABSTRACT

An accelerated test method evaluates, under accelerated conditions (a temperature $T_2$ and a voltage $V_2$), an endurance characteristic of a ferroelectric memory device having a capacitor element including a ferroelectric film under actual operating conditions (a temperature $T_1$ and a voltage $V_1$). An acceleration factor (K) required to evaluate the endurance characteristic is derived by using an expression: $\log K = A(1/V_1 - 1/V_2) + B(1/V_1 T_1 - 1/V_2 T_2)$ (where each of A and B is a constant).

1 Claim, 5 Drawing Sheets

ACCELERATED TEST METHOD FOR FERROELECTRIC MEMORY DEVICE

BACKGROUND OF THE INVENTION

The present invention relates to an accelerate test method for evaluating the endurance characteristic of a ferroelectric memory device comprising a capacitor element having a ferroelectric film.

The endurance characteristic of a ferroelectric memory device comprising a capacitor element having a ferroelectric film (ferroelectric capacitor) is determined by a polarization inversion fatigue characteristic in which the remanence of the ferroelectric film decreases with the increase of the number of the occurrences of polarization inversion in the ferroelectric film. For an accelerated test for evaluating the endurance characteristic, a method using only a voltage stress as an accelerated condition has been used conventionally.

Referring to FIGS. 5 and 6, a description will be given herein below to a first conventional embodiment (Japanese Laid-Open Patent Publication No. HEI 11-174026) in which the endurance characteristic of a ferroelectric memory device is evaluated by an accelerated test method using only a voltage stress as an accelerated condition.

As shown in FIG. 5, a first regression line at a first polarization inversion voltage $V_1$ is determined by measuring remanences while gradually increasing the number N of the occurrences of polarization inversion at the first polarization inversion voltage $V_1$ in a ferroelectric capacitor and plotting the number N of the occurrences of polarization inversion as abscissa and the decrease rate of the remanence as ordinate. Then, the foregoing operation is repeatedly performed even at a second polarization inversion voltage $V_2$ and a third polarization inversion voltage $V_3$, whereby a second regression line at the second polarization inversion voltage $V_2$ and a third regression line at the third polarization inversion voltage $V_3$ are obtained.

Next, first, second, and third numbers $NL_1$, $NL_2$, and $NL_3$ of the occurrences of polarization inversion when the remanence reaches a specified decrease rate relative to the initial value thereof are obtained based on the first, second, and third regression lines.

Next, a regression line (hereinafter referred to as a linear model) shown in FIG. 6 which is represented by $\log NL = C - \alpha V$ (where each of C and $\alpha$ is a constant) is determined from the first, second, and third polarization inversion voltages $V_1$, $V_2$, and $V_3$ and from the first, second, and third numbers $NL_1$, $NL_2$, and $NL_3$ of the occurrences of polarization inversion.

Next, the number of the occurrences of polarization inversion indicative of an expected lifetime (e.g., the number $NL_b$ of the occurrences of polarization inversion) under an accelerated condition (e.g., polarization inversion voltage $V_b$) which corresponds to the number of the occurrences of polarization inversion (e.g., the number $NL_a$ of the occurrences of polarization inversion) indicative of an expected lifetime under an actual operating condition (e.g., polarization inversion voltage $V_a$) is determined from the linear model shown in FIG. 6.

By thus conducting an accelerated test on the ferroelectric memory device under accelerated conditions (the polarization inversion voltage $V_b$ and the number $NL_b$ of the occurrences of polarization inversion), the endurance characteristic thereof under actual operating conditions (the polarization inversion voltage $V_a$ and the number $NL_a$ of the occurrences of polarization inversion) is evaluated in a short period of time.

Referring to FIG. 7, a description will be given herein below to a second conventional embodiment (see Jpn. J. Appl. Phys., Vol. 33 (1994) pp. 3996–4002) in which the endurance characteristic of a ferroelectric memory device is evaluated by an accelerated test method using only a voltage stress as an accelerated condition.

FIG. 7 shows a relationship between the logarithm of the number of the occurrences of polarization inversion and the reciprocal of a polarization inversion voltage.

First, the remanence is measured in the ferroelectric capacitor while gradually increasing the number Lc of the occurrences of polarization inversion at a specified polarization inversion voltage so that the number Lc of the occurrences of polarization inversion when the measured remanence reaches a specified decrease rate relative to the initial value of the remanence is determined. By repeatedly performing the foregoing sequence of processes for determining the number Lc of the occurrences of polarization inversion a plurality of times while changing the specified polarization inversion voltage, the number Lc of the occurrences of polarization inversion at each of the specified polarization inversion voltages is determined.

Next, the regression line (hereinafter referred to as a reciprocal model) shown in FIG. 7 which is represented by $\log Lc = B + d/V$ (where each of B and d is a constant) is determined by plotting the number (Lc) of the occurrences of polarization inversion as ordinate and the reciprocal of the specified polarization inversion voltage (V) as abscissa.

Next, from the reciprocal model of FIG. 7, the number of the occurrences of polarization inversion (e.g., the number $Lc_e$ of the occurrences of polarization inversion) indicative of an expected lifetime under an accelerated condition (e.g., a polarization inversion voltage $V_e$) which corresponds to the number of the occurrences of polarization inversion (e.g., the number $Lc_d$ of the occurrences of polarization inversion) indicative of an expected lifetime under an actual operating condition (e.g., a polarization inversion voltage $V_d$) is determined.

By thus conducting an accelerated test on the ferroelectric memory device under the accelerated conditions (the polarization inversion voltage $V_e$ and the number $Lc_e$ of the occurrences of polarization inversion), the endurance characteristic thereof under the actual operating conditions (the polarization inversion voltage $V_d$ and the number $Lc_d$ of the occurrences of polarization inversion) is evaluated.

As a result of examining which one of the first conventional embodiment (linear model) and the second conventional embodiment (reciprocal model) each evaluating the endurance characteristic of a ferroelectric memory device by an accelerated test method using only the voltage stress as an accelerated condition performs an accelerated test which provides the endurance characteristic with a higher fittability to the actual endurance characteristic, the present inventors have concluded that the accelerated test using the reciprocal model provides the endurance characteristic with a higher fittability.

As a result of repeatedly performing an accelerated test on the endurance characteristic of a ferroelectric memory device by using the reciprocal model using only the voltage stress as an accelerated condition, however, the present inventors have found that even the accelerated test using the reciprocal model is unsatisfactory in terms of the fittability to the actual endurance characteristic of a ferroelectric memory device.

SUMMARY OF THE INVENTION

In view of the foregoing, it is therefore an object of the present invention to further improve the fittability of the evaluated endurance characteristic of a ferroelectric memory device comprising a capacitor element having a ferroelectric material to the actual endurance characteristic thereof.

To attain the object, the present inventors have further examined the reciprocal model. Although the foregoing conventional second embodiment discloses that the accelerated test using the reciprocal model is hardly influenced by a temperature stress, the present inventors doubted about the truth of the disclosure, repeatedly conducted experiments at various accelerated temperatures, and observed variations in remanence with the increase of the number of the occurrences of polarization inversion in the ferroelectric film of a ferroelectric capacitor (variations in remanence with time). As a result, the present inventors found that the variations in remanence with the increase of the number of the occurrences of polarization inversion in the ferroelectric film are greatly affected by the accelerated temperatures, i.e., that the variations in remanence are largely dependent on the accelerated temperatures and also found that an accelerated test using the reciprocal model using only a voltage stress is lower in the degree of acceleration than an accelerated test using both the voltage stress and a temperature stress.

The present invention has been achieved based on the foregoing findings. Specifically, the present invention provides an accelerated test method for evaluating, under accelerated conditions (a temperature $T_2$ and a voltage $V_2$), an endurance characteristic of a ferroelectric memory device comprising a capacitor element having a ferroelectric film under actual operating conditions (a temperature $T_1$ and a voltage $V_1$), the method comprising the step of: deriving an acceleration factor (K) required to evaluate the endurance characteristic by using an expression:

$$\log K = A(1/V_1 - 1/V_2) + B(1/V_1 T_1 - 1/V_2 T_2)$$

(where each of A and B is a constant).

Since the accelerated test method for a ferroelectric memory device derives the acceleration factor (K) required to evaluate the endurance characteristic by using the first expression: $\log K = A(1/V_1 - 1/V_2) + B(1/V_1 T_1 - 1/V_2 T_2)$ which allows the calculation of the acceleration factor (K) considering the voltage stress and the temperature stress, the fittability of the evaluated endurance characteristic of the ferroelectric memory device to the actual endurance characteristic thereof is improved greatly.

Preferably, the accelerated test method for a ferroelectric memory device further comprises the step of: determining the constants A and B by measuring polarization-inversion-voltage dependence of a remanence of the ferroelectric film which varies with increase of the number of occurrences of polarization inversion in the ferroelectric film at each of a plurality of temperatures.

If the constants A and B in the first expression are thus determined by measuring the polarization-inversion-voltage dependence of the remanence of the ferroelectric film which varies with the increase of the number of the occurrences of polarization inversion in the ferroelectric film at each of the plurality of temperatures, the accuracy of the first expression is increased so that the fittability of the evaluated endurance characteristic of the ferroelectric memory device to the actual endurance characteristic thereof is further improved.

Preferably, the accelerated test method for a ferroelectric memory device further comprises the step of: measuring a remanence of the ferroelectric film which varies with increase of the number of occurrences of polarization inversion in the ferroelectric film at each of a plurality of polarization inversion voltages (V) at a specified temperature (T), determining the number (Lc) of occurrences of polarization inversion when the determined remanence reaches a specified decrease rate relative to an initial value thereof, performing, a plurality of times, a sequence of processes for determining a constant a from the plurality of polarization inversion voltages (V), the numbers (Lc) of occurrences of polarization inversion, and an expression: $\log Lc = C + \alpha/V$ (where each of C and $\alpha$ is a constant), while varying the specified temperature (T), to determine a constant ($\alpha$) at each of the specified temperatures (T), and determining the constants A and B from the constant ($\alpha$) determined at each of the specified temperatures (T) and an expression: $\alpha = A + B/T$.

If the sequence of processes for determining the constant a from the plurality of polarization inversion voltages (V), the numbers (Lc) of the occurrences of polarization inversion, and the second expression: $\log Lc = C + \alpha/V$ (each of C and $\alpha$ is a constant) are thus performed a plurality of times, while varying the specified temperature (T), the constant ($\alpha$) is thereby determined at each of the specified temperatures (T), and the constants A and B in the first expression is determined from the constant ($\alpha$) determined at each of the specified temperatures (T) and the third expression: $\alpha = A + B/T$, the accuracy of the first expression is increased so that the fittability of the evaluated endurance characteristic of the ferroelectric memory device to the actual endurance characteristic thereof is further improved.

DETAILED DESCRIPTION OF THE INVENTION

Figure 1:
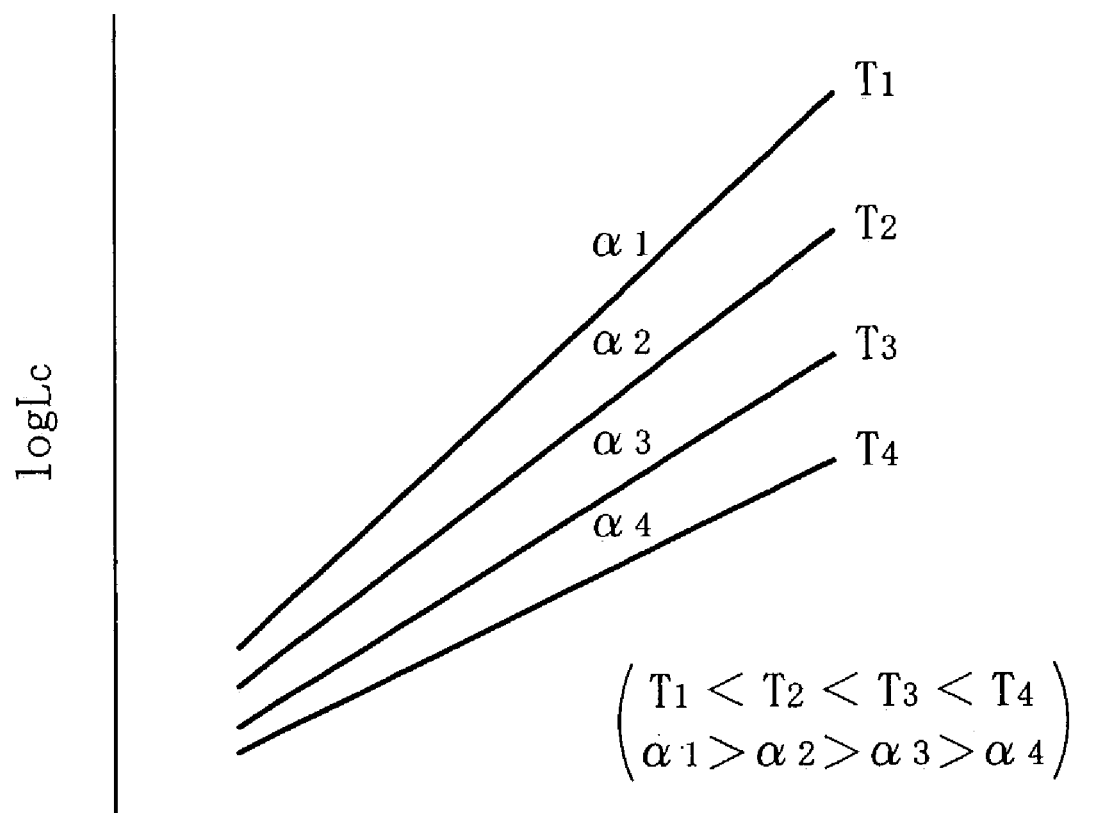
FIG. 1 is a graph showing a relationship between the logarithm of the number of the occurrences of polarization inversion and the reciprocal of a polarization inversion voltage at each of a plurality of temperatures.

Referring to FIGS. 1 to 4, an embodiment of the present invention will be described herein below.

In an accelerated test for evaluating, under an accelerated condition, the endurance characteristic of a ferroelectric memory device comprising a capacitor element having a ferroelectric film (ferroelectric capacitor) under an actual operating condition, it is necessary to predetermine an acceleration factor (K) required to evaluate the endurance characteristic. Since an accelerated test method according to the present invention uses both a voltage stress and a temperature stress, it is necessary for the determination of the acceleration factor to determine a model considering the degree of the influence of the endurance characteristic of the ferroelectric memory device comprising the ferroelectric capacitor by voltage acceleration and temperature acceleration, i.e., the polarization-inversion-voltage dependence and temperature dependence of the endurance characteristic of the ferroelectric memory device.

The endurance characteristic of the ferroelectric memory device comprising the ferroelectric capacitor is determined by the polarization inversion fatigue characteristic in which the remanence of the ferroelectric film decreases with the increase of the number of the occurrences of polarization inversion in the ferroelectric film of the ferroelectric capacitor. Therefore, the model considering the polarization-inversion-voltage dependence and temperature dependence of the endurance characteristic of the ferroelectric memory device can be determined by measuring the polarization-inversion-voltage dependence and temperature dependence of the polarization inversion fatigue characteristic in which the remanence of the ferroelectric film decreases with the increase of the number of the occurrences of polarization inversion in the ferroelectric film of the ferroelectric capacitor.

Based on the foregoing concept, the present inventors have determined the model as follows.

First, in a ferroelectric capacitor, the polarization-inversion-voltage dependence of the remanence of a ferroelectric film composing the ferroelectric capacitor which varies with the increase of the number of the occurrences of polarization inversion in the ferroelectric film is measured at each of first, second, third, and fourth temperatures $T_1$, $T_2$, $T_3$, and $T_4$ ($T_1 < T_2 < T_3 < T_4$).

Specifically, the number (Lc) of the occurrences of polarization inversion when the remanence at each of first, second, third, and fourth temperatures $T_1$, $T_2$, $T_3$, and $T_4$ reaches a specified decrease rate relative to the initial value thereof is determined at each of a plurality of polarization inversion voltages (V). Then, the determined number (Lc) of the occurrences of polarization inversion is plotted as ordinate and the plurality of polarization inversion voltages (V) are plotted as abscissa, whereby the reciprocal model shown in FIG. 1 which is represented by $$\log Lc = C + \alpha/V \qquad \text{Expression (1)}$$

(where each of C and $\alpha$ is a constant) is determined at each of the first, second, third, and fourth temperatures $T_1$, $T_2$, $T_3$, and $T_4$.

The present inventors have found that the gradient of a straight line representing the polarization-inversion-voltage dependence of the change of the remanence (the change with time of the remanence) with the increase of the number (Lc) of the occurrences of polarization inversion in the ferroelectric film is different at each of the first, second, third, and fourth temperatures $T_1$, $T_2$, $T_3$, and $T_4$. In other words, the present inventors have found that the polarization-inversion-voltage dependence of the change of the remanence with the increase of the number (Lc) of the occurrences of polarization inversion in the ferroelectric film is largely dependent on accelerated temperatures (T).

Accordingly, $\alpha_1$ as a constant ($\alpha$) corresponding to the first temperature $T_1$ can be determined from the number (Lc) of the occurrences of polarization inversion when the remanence calculated at each of the plurality of polarization inversion voltages (V) at the first temperature $T_1$ reaches a specified decrease rate relative to the initial value thereof, and the plurality of polarization inversion voltages (V), and Expression (1). Likewise, $\alpha_2$, $\alpha_3$, and $\alpha_4$ as constants ($\alpha$) corresponding to the second, third, and fourth temperatures $T_2$, $T_3$, and $T_4$ can be determined ($\alpha_1 > \alpha_2 > \alpha_3 > \alpha_4$).

Thus, it will be understood that the polarization-inversion-voltage dependence of the remanence of a ferroelectric film which changes with the increase of the number (Lc) of the occurrences of the ferroelectric film is represented by the reciprocal model in which the logarithm of the number (Lc) of the occurrences of polarization inversion and the reciprocal of the polarization inversion voltage (V) are regressed with a straight line, as shown in FIG. 1, and that the polarization-inversion-voltage dependence of the remanence of the ferroelectric film which changes with the increase of the number (Lc) of the occurrences of polarization inversion in the ferroelectric film is largely dependent on the accelerated temperature (T).

Next, an acceleration-factor calculating expression for calculating an acceleration factor (K) required to evaluate, under accelerated conditions, the endurance characteristic of a ferroelectric memory device having a ferroelectric capacitor under actual operating conditions is derived.

First, since the constant ($\alpha$) in Expression (1) changes at each of measurement temperatures (T) so that a relational expression between the constant ($\alpha$) and the temperature (T) becomes necessary. The relational expression between the constant ($\alpha$) and the temperature (T) is determined from the following fact.

That is, a relationship regressed with a straight line is established between the logarithm of a dielectric breakdown lifetime and the reciprocal of a voltage in the ferroelectric capacitor. On the other hand, the endurance characteristic of the ferroelectric memory device has a correlation with the leakage current value of the ferroelectric capacitor and is more excellent as the leakage current value is smaller. The two phenomena indicate that the mechanism of polarization inversion fatigue in which the remanence of the ferroelectric film decreases with an increase in the number (Lc) of the occurrences of polarization inversion in the ferroelectric film is closely related to the dielectric characteristic.

With regard to the dielectric breakdown of a common insulating film including a ferroelectric film, it has been known that the voltage dependence of the dielectric breakdown of, e.g., a silicon oxide film changes with temperature. It has been reported that the relationship between the gradient ($\gamma$) of the voltage dependence and the temperature (T) is represented by:

$$\gamma = A + B/T \text{ (where each of } A \text{ and } B \text{ is a constant)} \qquad \text{Expression (2).}$$

(see "Acceleration Factors for Thin Oxide Breakdown," pp. 1903–1908, J. W. McPherson and D. A. Baglee: J. Electrochem. Soc., (1985)).

If consideration is given to the fact that the mechanism of polarization inversion fatigue is closely related to the dielectric characteristic and to the fact that the voltage dependence of the dielectric breakdown of a common insulating film including a ferroelectric film changes with temperature, as described above, it can be assumed that the relationship represented by Expression (2) is also applicable to the dielectric breakdown of the ferroelectric capacitor.

In other words, it can be assumed that the relationship represented by:

$$\alpha = A + B/T \text{ (where each of } A \text{ and } B \text{ is a constant)} \qquad \text{Expression (3)}$$

is established between the gradient (α) of the voltage dependence and the temperature (T) also for the voltage dependence of the endurance characteristic of a ferroelectric memory device comprising a ferroelectric capacitor, which is closely related to the dielectric characteristic, in the same manner as in Expression (2).

If $L_1$ represents the endurance characteristic lifetime under the actual operating conditions (the temperature $T_1$ and the polarization inversion voltage $V_1$) of the ferroelectric memory device comprising the ferroelectric capacitor and $L_2$ represents the endurance characteristic lifetime under the accelerated conditions (the temperature $T_2$ and the polarization inversion voltage $V_2$) thereof ($T_1<T_2$, $V_1<V_2$), the acceleration factor (K) required to evaluate, under the accelerated conditions (the temperature $T_2$ and the polarization inversion voltage $V_2$), the endurance characteristic of the ferroelectric memory device under the actual operating conditions (the temperature $T_1$ and the polarization inversion voltage $V_1$) can be derived from Expressions (1) and (3) based on the acceleration-factor calculating expression represented by:

$$\log K = \log(L_1/L_2) = A(1/V_1 - 1/V_2) + B(1/V_1T_1 - 1/V_2T_2) \quad \text{Expression (4)}.$$

The constants A and B in Expression (4) as the acceleration-factor calculating expression can be determined by measuring, at a plurality of temperatures (T), the polarity-inversion-voltage dependence of the remanence of a ferroelectric film which varies with the increase of the number (Lc) of the occurrences of polarization inversion in the ferroelectric film. Specifically, the constants A and B can be determined from the constants $\alpha_1$, $\alpha_2$, $\alpha_3$, and $\alpha_4$ corresponding to the first, second, third, and fourth temperatures $T_1$, $T_2$, $T_3$, and $T_4$ that have been calculated in consideration of Expression (1) and from Expression (3): $\alpha = A + B/T$.

Thus, since the present embodiment derives the acceleration factor (K) required to evaluate the endurance characteristic of a ferroelectric memory device by using Expression (4): $\log K = A(1/V_1 - 1/V_2) + B(1/V_1T_1 - 1/V_2T_2)$ as the acceleration-factor calculating expression which allows calculation considering a voltage stress and a temperature stress, the fittability of the evaluated endurance characteristic of the ferroelectric memory device to the actual endurance characteristic thereof is improved significantly. As a result, an accelerated test method which allows higher-precision and more efficient evaluation of the endurance characteristic of the ferroelectric memory device is provided. If the constants A and B in Expression (4) as the acceleration-factor calculating expression are determined by measuring, at each of a plurality of temperatures (T), the polarity-inversion-voltage dependence of the remanence of a ferroelectric film which varies with the increase of the number of the occurrences of polarity inversion in the ferroelectric film, the accuracy of Expression (4) as the acceleration-factor calculating expression is increased so that the fittability of the evaluated endurance characteristic of the ferroelectric memory device to the actual endurance characteristic thereof is further improved.

A description will be given herein below to the accelerated test method according to the present embodiment by using a specific example.

The description will be given first to a method for determining the constants A and B in Expression (4) as the acceleration-factor calculating expression to calculate an acceleration factor (K) required to evaluate the endurance characteristic of a ferroelectric memory device under actual operating conditions.

Specifically, the polarity-inversion-voltage dependence of the remanence (Pnv) of a ferroelectric film which varies with the increase of the number (Lc) of the occurrences of polarity inversion in the ferroelectric film composing a ferroelectric capacitor are measured at each of temperatures of 85° C., 100° C., 110° C., and 125° C. As for the temperatures, they are not limited to the foregoing ones provided that two or more different temperatures are used.

Figure 2:
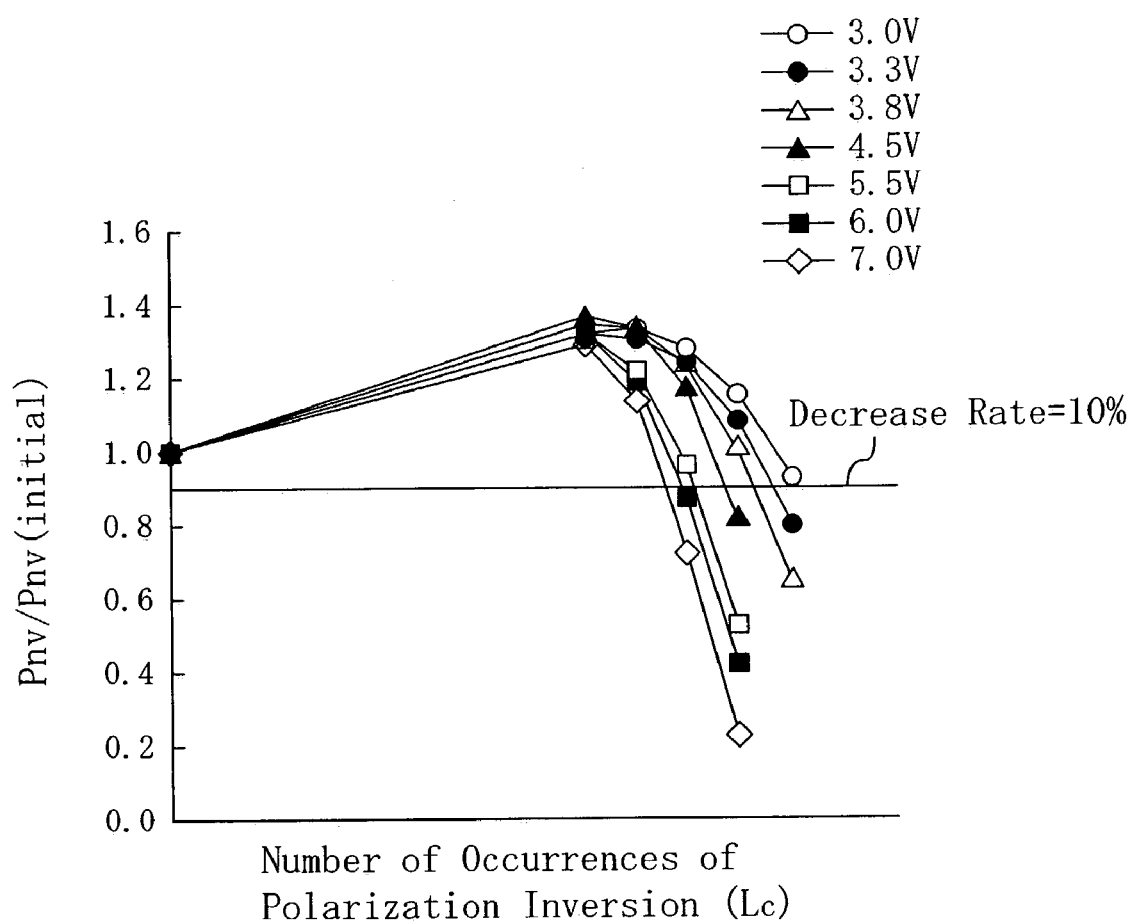
FIG. 2 is a graph showing a relationship between a remanence and the number of the occurrences of polarization inversion at each of a plurality of polarization inversion voltages.

FIG. 2 shows the remanence (Pnv) of the ferroelectric film composing the ferroelectric capacitor which varies, at a temperature of 125° C., with the increase of the number (Lc) of the occurrences of polarization inversion in the ferroelectric film at each of the polarization inversion voltages (V) in the range of 3 V to 7 V. Although the voltages in the range of 3 V to 7V are used as the polarization inversion voltages (V), as shown in FIG. 2, the polarization inversion voltages (V) are not limited to the voltages in the foregoing range. The remanences (Pnv) that have been normalized with a predetermined initial value are plotted as ordinate, while the numbers (Lc) of the occurrences of polarization inversion are plotted as abscissa.

As shown in FIG. 2, the endurance characteristic lifetime (Lc) at each of the polarization inversion voltages (V) is determined by considering the number (Lc) of the occurrences of polarization inversion when the decrease rate of the remanence (Pnv) relative to the initial value thereof becomes 10% as the endurance characteristic lifetime (Lc). Although the number (Lc) of the occurrences of polarization inversion when the decrease rate of the remanence (Pnv) relative the initial value thereof becomes 10% is considered as the endurance characteristic lifetime (Lc) in the present embodiment, the decrease rate may also be set to any percentage. In FIG. 2, the decrease rate (10%) of the remanence (Pnv) relative to the initial value thereof is indicated by the solid line parallel with the abscissa axis.

The number (Lc) of the occurrences of polarization inversion corresponding to the point of intersection of the solid line indicative of the 10% decrease rate of the remanence (Pnv) relative to the initial value thereof and the solid indicative of the remanence (Pnv) of the ferroelectric film which varies with the increase of the number (Lc) of the occurrences of polarization inversion in the ferroelectric film at each of the polarization inversion voltages (V) becomes the endurance characteristic life (Lc), which is determined at each of the polarization inversion voltages (V). The foregoing sequence of processes are repeatedly performed also at each of the other temperatures of 85° C., 100° C., and 110° C. so that the endurance characteristic lifetime (Lc) at each of the polarization inversion voltages (V) is determined.

Figure 3:
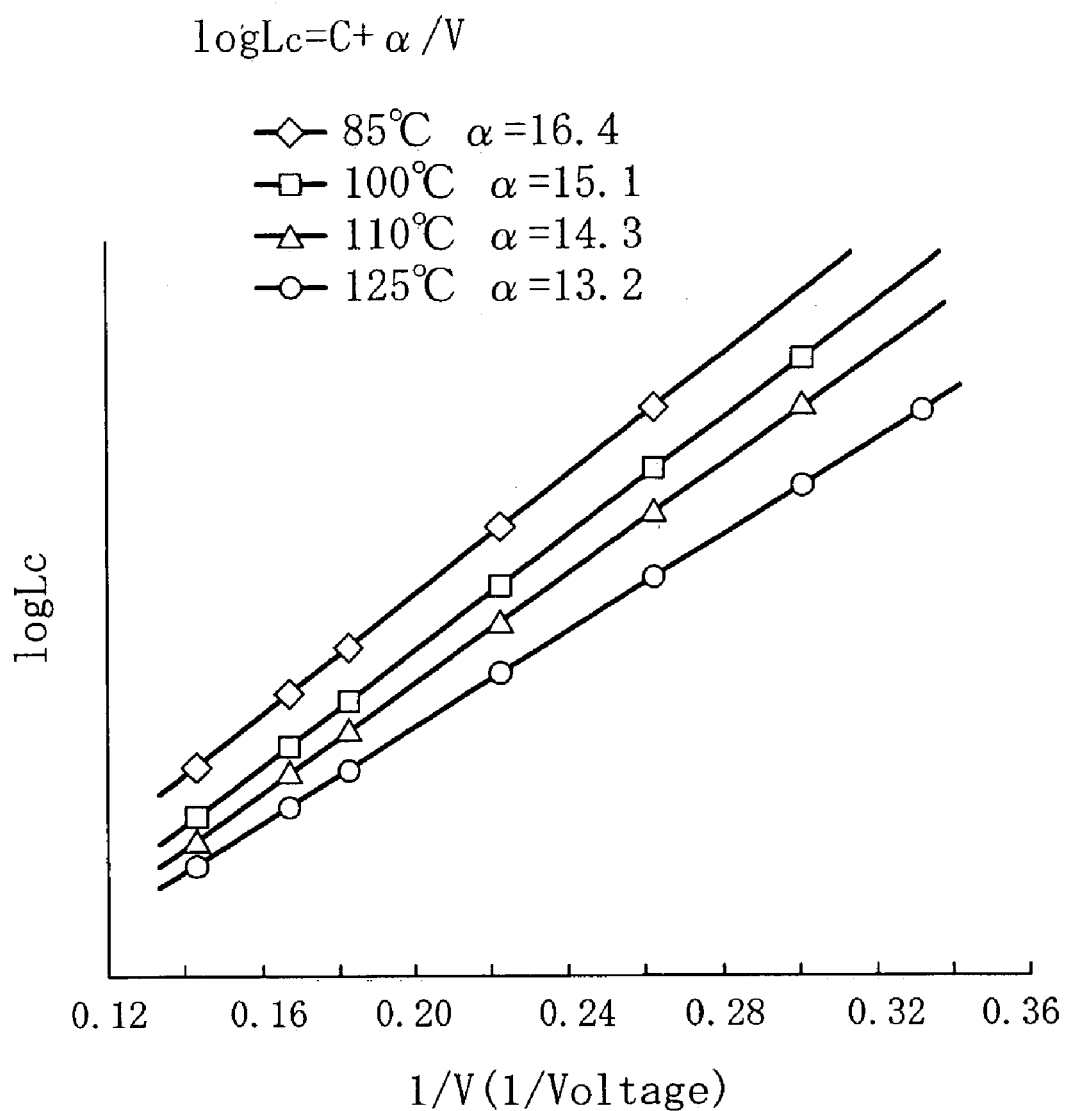
FIG. 3 is a graph showing a relationship between the logarithm of the number of the occurrences of polarization inversion and the reciprocal of a polarization inversion voltage at each of a plurality of temperatures.

Next, the respective numbers (Lc) of the occurrences of polarization inversion determined in the manner described above at the temperatures of 125° C., 85° C., 100° C., and 110° C. are plotted as ordinate and the reciprocals of the polarization inversion voltages (V) in the voltage range of 3 to 7 V are plotted as abscissa, whereby the reciprocal model represented by Expression (1): $\log Lc = C + \alpha/V$ is determined, as shown in FIG. 3. From the respective numbers (Lc) of the occurrences of polarization inversion determined at the temperatures of 125° C., 85° C., 100° C., and 110° C., the plurality of polarization inversion voltages (V), and Expression (1): $\log Lc = C + \alpha/V$, respective constants (α) at the temperatures of 125° C., 85° C., 100° C., and 110° C. are determined. As a result, 16.4, 15.1, 14.3, and 13.2 can be determined as the respective constants (α) corresponding to the temperatures of 85° C., 100° C., 110° C., and 125° C.

Figure 4:
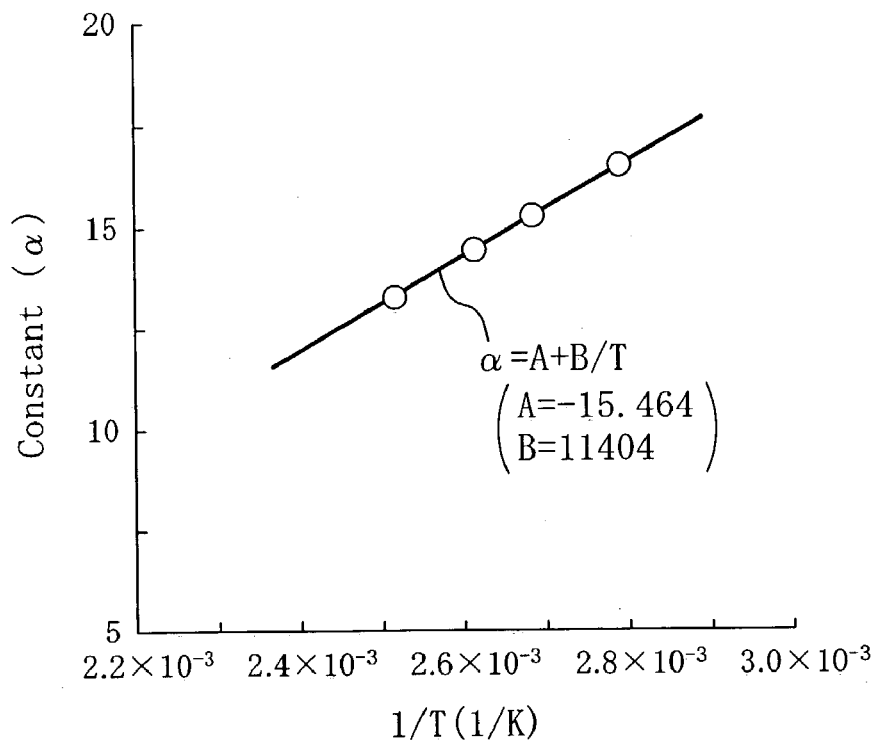
FIG. 4 is a graph showing a relationship between a constant and the reciprocal of a temperature.
Figure 5:
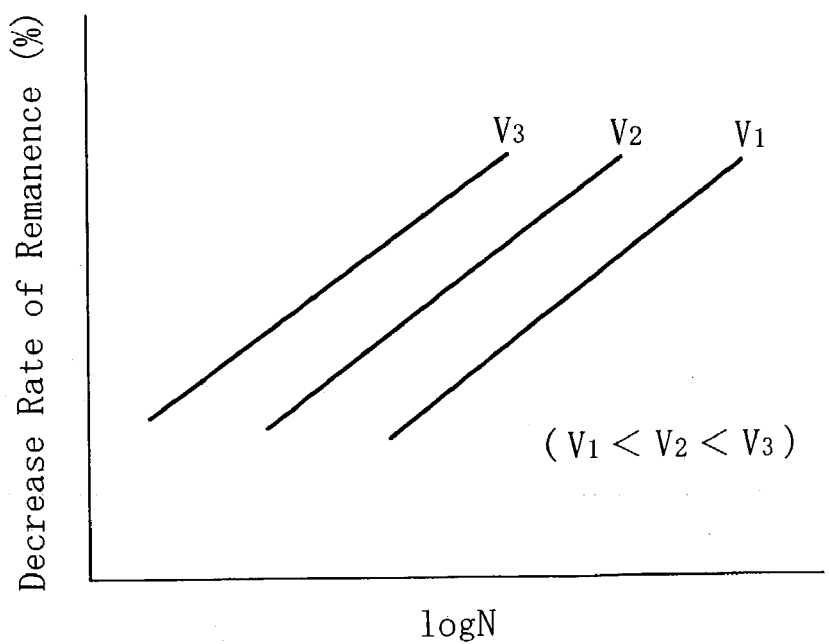
FIG. 5 is a graph showing a relationship between the decrease rate of a remanence and the logarithm of the number of the occurrences of polarization inversion in a first conventional embodiment.
Figure 6:
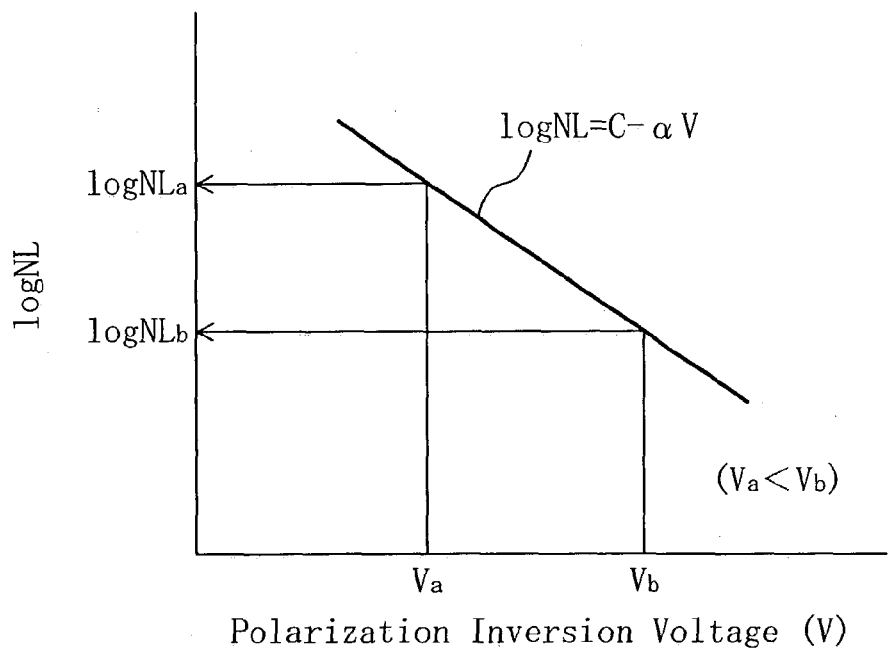
FIG. 6 is a graph showing a linear model in the first conventional embodiment.
Figure 7:
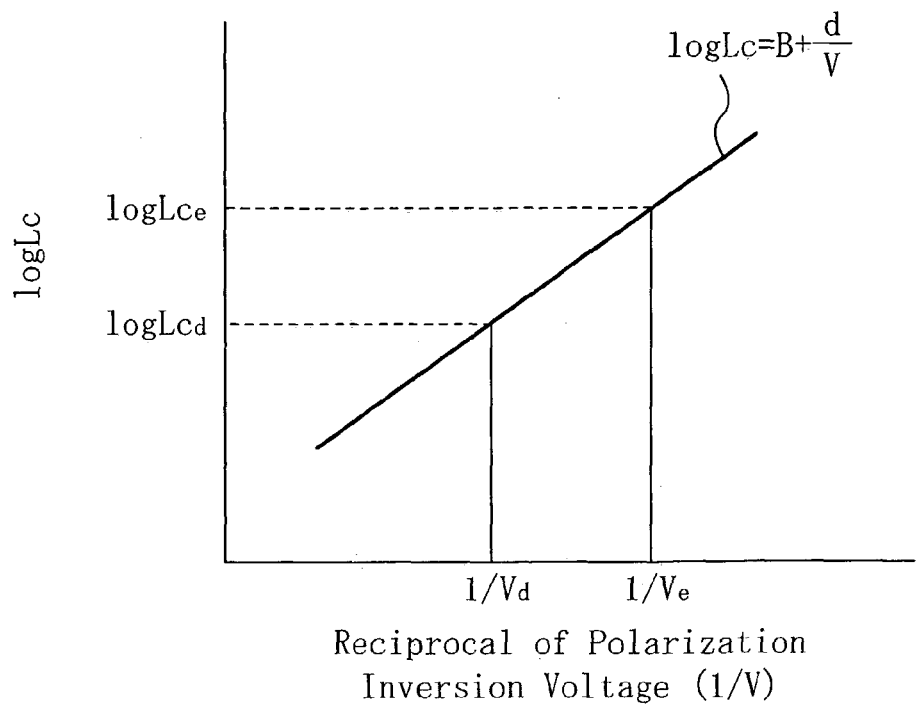
FIG. 7 is a graph showing a reciprocal model in a second conventional embodiment.

Next, as shown in FIG. 4, constants A and B are determined from Expression (3): $\alpha = A + B/T$ and the respective constants of 16.4, 15.1, 14.3, and 13.2 corresponding to the temperatures of 85° C., 100° C., 110° C., and 125° C. Consequently, the constant A=−15.464 and the constant A=11404 are satisfied so that Expression (4) as the acceleration-factor calculating expression is completed by using the constants A and B.

Next, the number (Lc) of the occurrences of polarization inversion indicative of an expected lifetime under accelerated conditions, which corresponds to the number (Lc) of the occurrences of polarization inversion indicative of an expected lifetime under actual conditions, is determined based on the accelerated-factor calculating expression that has been completed. Specifically, if the acceleration factor (K) when an accelerated test is performed at a polarization inversion voltage of 7.5 V and a temperature of 125° C. as accelerated conditions corresponding to evaluation which guarantees $10^{12}$ times as the number of the occurrences of polarization inversion at a polarization inversion voltage of, e.g., 3.3 V and a temperature of, e.g., 85° C. as actual operating conditions is calculated, the acceleration factor K=1615 is determined.

By using the acceleration-factor calculating expression in which the acceleration factor K=1615 has been substituted, about $6 \times 10^8$ times is obtainable as the number of the occurrences of polarization inversion under accelerated conditions which corresponds to $10^{12}$ times as the number of times of polarization inversion to be guaranteed under actual operating conditions. Accordingly, the endurance characteristic corresponding to the case where the polarization inversion voltage is 3.3 V, the temperature is 85° C., and the number of the occurrences of polarization inversion is $10^{12}$ as actual operating conditions can be determined by performing an accelerated test by setting the polarization inversion voltage to 7.5V, the temperature to 125° C., and the number of the occurrences of polarization inversion to $6 \times 10^8$ as accelerated conditions. This greatly improves the fittability of the evaluated endurance characteristic of the ferroelectric memory device to the actual endurance characteristic thereof and thereby provides an accelerated test method which allows more precise and more efficient evaluation of the endurance characteristic of a ferroelectric memory device.

What is claimed is:

1. An accelerated test method for evaluating, under accelerated conditions (a temperature $T_2$ and a voltage $V_2$), an endurance characteristic of a ferroelectric memory device comprising a capacitor element having a ferroelectric film under actual operating conditions (a temperature $T_1$ and a voltage $V_1$), the method comprising the step of:

deriving an acceleration factor (K) required to evaluate the endurance characteristic by using a following expression (1):

$$\log K = A(1/V_1 - 1/V_2) + B(1/V_1 T_1 - 1/V_2 T_2)$$

(where each of A and B is a constant), the method further comprising the sub-steps:

determining the number (Lc) of occurrences of polarization inversion when a remanence of the ferroelectric film reaches a specified decrease rate at each of a plurality of polarization inversion voltages (V) at a plurality of temperatures;

determining a constant ($\alpha$) at a specified temperature (T) by using a following expression (2):

$$\log Lc = C + \alpha/V \text{(where each of } C \text{ and } \alpha \text{ is a constant)} \quad (2); \text{ and}$$

determining the constants A and B by using a following expression (3):

$$\alpha = A + B/T \quad (3).$$

* * * * *

UNITED STATES PATENT AND TRADEMARK OFFICE
CERTIFICATE OF CORRECTION

| | |
|---|---|
| PATENT NO. | : 7,111,210 B2 |
| APPLICATION NO. | : 10/632960 |
| DATED | : September 19, 2006 |
| INVENTOR(S) | : Katsuki Nagahashi et al. |

Page 1 of 1

It is certified that error appears in the above-identified patent and that said Letters Patent is hereby corrected as shown below:

On the title page

Item "(56) References Cited, U.S. PATENT DOCUMENTS", add --5,337,279 8/1994 Gregory et al. --

Item "(56) References cited, OTHER PUBLICATIONS", change "Polarization Fatigue Characteristics of Sol-Gel Ferroelectric" to --Polarization Fatigue Characteristics of Sol-Gel Ferroelectric Pb $(Zr_{0.4}Ti_{0.6})O_3$ Thin-Film Capacitors --

Signed and Sealed this

Sixth Day of March, 2007

JON W. DUDAS
*Director of the United States Patent and Trademark Office*